(12) United States Patent
Yang et al.

(10) Patent No.: US 11,162,985 B2
(45) Date of Patent: Nov. 2, 2021

(54) ELECTRONIC MEASURING DEVICE

(71) Applicant: Fluke Corporation, Everett, WA (US)

(72) Inventors: Yinhong Yang, Shanghai (CN); Jinbo He, Shanghai (CN); Zhangyan Zhao, Shanghai (CN)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 16/751,517

(22) Filed: Jan. 24, 2020

(65) Prior Publication Data

US 2020/0241055 A1    Jul. 30, 2020

(30) Foreign Application Priority Data

Jan. 25, 2019 (CN) .......................... 201910074890.3

(51) Int. Cl.
*G01R 21/06* (2006.01)
*G01L 5/00* (2006.01)
*H05K 9/00* (2006.01)

(52) U.S. Cl.
CPC ............ *G01R 21/06* (2013.01); *G01L 5/0095* (2013.01); *H05K 9/0032* (2013.01)

(58) Field of Classification Search
CPC .... G01R 21/06; G01R 15/144; G01R 15/146; G01R 15/14; G01R 1/18; G01L 5/0095; H05K 9/0032
USPC ......................................................... 324/110
See application file for complete search history.

(56) References Cited

U.S. PATENT DOCUMENTS

| | | | |
|---|---|---|---|
| 6,183,292 B1 | 2/2001 | Chen et al. | |
| 2003/0111264 A1* | 6/2003 | Tan | G01R 1/18 174/267 |
| 2003/0132742 A1* | 7/2003 | Harding | G06Q 50/06 324/110 |
| 2006/0219436 A1* | 10/2006 | Taylor | G01R 15/202 174/529 |
| 2014/0375305 A1 | 12/2014 | Kawase | |
| 2015/0015152 A1 | 1/2015 | Aboulnaga et al. | |
| 2017/0164498 A1* | 6/2017 | Song | H05K 3/301 |

(Continued)

OTHER PUBLICATIONS

Fluke Corporation, "MDA-550/MDA-510 Motor Drive Analyzer Users Manual", XP002798957, Sep. 1, 2018, 36 pages.

(Continued)

*Primary Examiner* — Tung X Nguyen
*Assistant Examiner* — Robert P Alejnikov, Jr.
(74) *Attorney, Agent, or Firm* — Seed Intellectual Property Law Group LLP

(57) ABSTRACT

An electronic measuring device includes a main printed circuit assembly and one or more channel modules. At least one channel module includes a channel printed circuit board and a first insulating housing that defines a cavity covering at least part of electrical elements mounted on the channel printed circuit board. A first conductive shielding frame is placed on the first insulating housing and is separated from the channel printed circuit board by the first insulating housing. The first conductive shielding frame covers the electrical elements mounted on the channel printed circuit board. A second insulating housing sandwiches the first conductive shielding frame between the second insulating housing and the first insulating housing which lengthens an electrical path from the first conductive shielding frame to the channel printed circuit board.

18 Claims, 11 Drawing Sheets

(56) References Cited

U.S. PATENT DOCUMENTS

2017/0190530 A1\* 7/2017 Seki .................. B65H 7/20
2018/0136259 A1\* 5/2018 Epperson ............. G01R 19/165

OTHER PUBLICATIONS

Fluke Corporation, "MDA-550/MDA-510 Motor Drive Analyzer Safety Information", XP002798956, Sep. 1, 2018, 7 pages.
Extended European Search Report for EP Application No. 20153728.9, dated Jun. 5, 2020, 11 pages.

\* cited by examiner

ELECTRONIC MEASURING DEVICE

BACKGROUND

Technical Field

The present application relates to the field of electronic measurement, and more particularly to an electronic measuring device.

Description of the Related Art

Power analyzers currently available on the market have functions such as measuring current and voltage, measuring the speed and torque of a motor, and calculating power. Accordingly, a typical power analyzer acquires information of current, voltage, and/or a motor by respectively using a current detection channel, a voltage detection channel, and/or a motor channel.

Power analyzers available on the market typically maintain a certain distance and space between different channels or between a channel and an instrument housing to meet safe insulation rating requirements (for example, CAT IV 600V or CAT III 1000V) of the International Electrotechnical Commission (IEC). Thus, such power analyzers are relatively larger in size due to the reserved distance and space. In other words, such power analyzers are typically desktop devices rather than portable, hand-held devices.

BRIEF SUMMARY

An objective of the present application is to provide an electronic measuring device capable of being smaller in size, but also capable of meeting insulation performance requirements for instruments. In addition, the electronic measuring device provided by the present application also has desirable electromagnetic compatibility.

In one aspect, an electronic measuring device is provided, comprising a main printed circuit assembly, and one or a plurality of channel modules mechanically and electrically connected to the main printed circuit assembly. At least one channel module of the one or a plurality of channel modules comprises a channel printed circuit board electrically connected to the main printed circuit assembly; a first insulating housing disposed on the channel printed circuit board, the first insulating housing defining a cavity, the cavity covering at least part of electrical elements mounted on the channel printed circuit board; a first conductive shielding frame disposed on the first insulating housing and separated from the channel printed circuit board via the first insulating housing, the first conductive shielding frame covering the at least part of electrical elements mounted on the channel printed circuit board; and a second insulating housing disposed on the first conductive shielding frame and configured to sandwich the first conductive shielding frame between the second insulating housing and the first insulating housing, so as to lengthen an electrical path from the first conductive shielding frame to the channel printed circuit board.

The foregoing is a summary of the present application where simplification, generalization, and omitted details may exist. Therefore, it should be appreciated by those skilled in the art that this section is for exemplary illustration only, and not intended to limit the scope of the present application by any means. This summary section is not intended to identify key features or essential features of the claimed subject matter, and is not intended to be used as a supplementary means to identify the scope of the claimed subject matter.

BRIEF DESCRIPTION OF THE SEVERAL VIEWS OF THE DRAWINGS

The aforementioned and other features of the present application will be more fully and clearly understood through the specification below and the appended claims with reference to the accompanying drawings. It can be understood that these accompanying drawings illustrate only a few embodiments of the present application, and therefore should not be considered as limiting the scope of the present application. The content of the present application will be described more explicitly and in more detail with the accompanying drawings.

DETAILED DESCRIPTION

Figure 1:
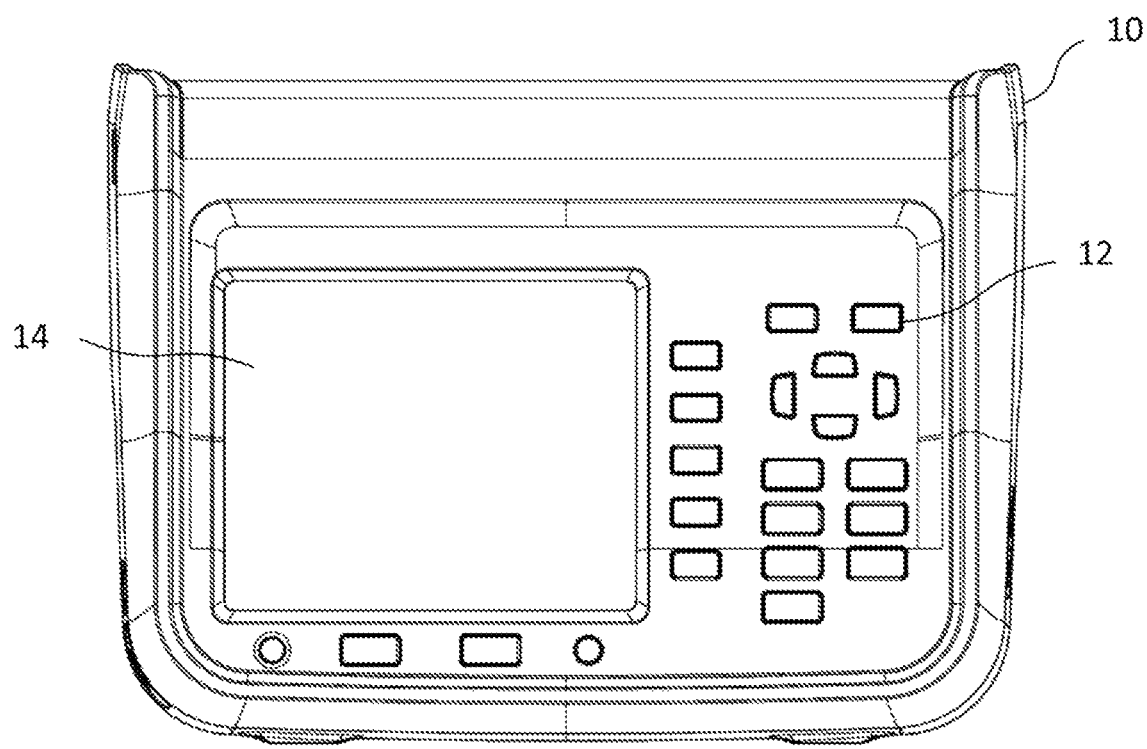
FIG. 1 shows a front view of a portable power analyzer according to one embodiment of the present application.

The following detailed description is made with reference to the accompanying drawings constituting a part of the description. Unless otherwise specified in the context, similar reference numerals usually represent similar components in the accompanying drawings. The illustrative embodiments described in the detailed description, the accompanying drawings, and the claims are not limiting. Without departing from the spirit or scope of the subject matter of the present application, other embodiments can be adopted and other modifications can be made. It can be understood that the various aspects of the present application generally described in the present application and graphically presented in the accompanying drawings may be arranged, replaced, combined, and designed in many different configurations, and these different configurations explicitly constitute a part of the present application.

Depending on different specific applications, the electronic measuring device of the present disclosure can be mounted with circuits and functional modules of different functions to achieve different electronic measuring applications and functions. In some embodiments, the electronic measuring device of the present disclosure is a power analyzer, an ammeter, a voltmeter, or a similar electronic measuring device. In addition, the electronic measuring device may be a desktop, vertical, or portable device. In the following embodiments, a portable power analyzer is used as an example to describe the electronic measuring device of the present disclosure. Those skilled in the art can make modification and replacements according to different practical applications and without limiting the present disclosure.

FIG. 1 shows a front view of a portable power analyzer 10 according to one embodiment of the present application. As shown in FIG. 1, the portable power analyzer 10 includes one or a plurality of buttons 12 configured to receive user input and a display screen 14 configured to display data. In certain embodiments, the display screen 14 can be a touch screen also capable of receiving input instructions from a user to operate the power analyzer 10. Accordingly, since input instructions can be received via the touch screen, in some embodiments the buttons 12 can be reduced in number or omitted. Those skilled in the art can appreciate that the portable power analyzer 10 may include other commonly used input or output devices.

Figure 2A:
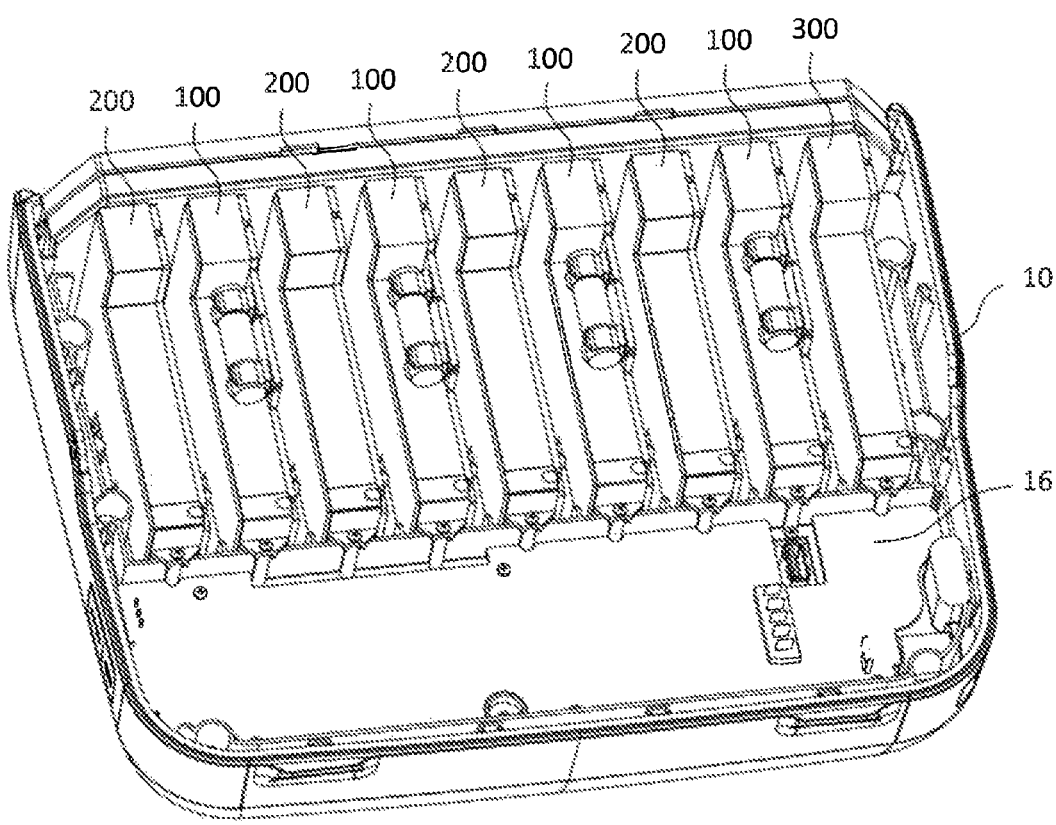
FIG. 2a shows a rear perspective view of a portable power analyzer according to one embodiment of the present application (a rear cover of the portable power analyzer in this drawing has been removed), and shows a plurality of channel modules of the power analyzer.

FIG. 2a shows a rear perspective view of a portable power analyzer 10 according to one embodiment of the present application (a rear cover of the portable power analyzer in this drawing has been removed) and shows a plurality of channel modules (100, 200, 300) of the power analyzer 10. As shown in FIG. 2a, the portable power analyzer 10 includes a main printed circuit assembly (PCA) 16 (only the rear side of the main PCA 16 is shown in this drawing) and a plurality of channel modules (100, 200, 300) mechanically and electrically connected to the main PCA 16. Each channel module is configured to receive a certain type of electrical signal and to collect and transmit the signal to the main PCA 16 for subsequent processing. As shown in FIG. 2a, the channel modules include current detection channel modules 100, voltage detection channel modules 200, and a motor detection channel module 300. While the portable power analyzer 10 shown in the embodiment of FIG. 2a includes four current detection channel modules 100, four voltage detection channel modules 200, and a motor channel module 300, those skilled in the art can understand that other embodiments may include other numbers of (more or less) channel modules having different types or may not have a certain type of channel modules (for example, having no motor channel module 300). In some embodiments, the channel modules can also be configured to output electrical signals or input/output signals. In other words, the present application does not limit the type and number of the channel modules.

With continued reference to FIG. 2a, the nine channel modules in FIG. 2a are configured to collectively face toward one side of the power analyzer 10 (vertically placed). However, in other embodiments, all nine channel modules can be oriented by collectively rotating around its long axis (i.e., in the direction from the top to the bottom of the portable power analyzer 10) at any angle. For example, in FIG. 2a, the nine channel modules can rotate by 90° in an arc direction, so that the nine channel modules collectively face toward the front of the power analyzer 10 (horizontally placed). In addition, the orientations of each channel may also be different. For example, the current detection channel modules 100 face toward one side of the power analyzer 10, whereas the voltage detection channel modules 200 and the motor channel module 300 face toward the other side of the power analyzer 10. It can be understood that those skilled in the art can choose the particular positions and orientations for channel modules according to actual requirements, and FIG. 2a only illustratively shows one embodiment.

Figure 2B:
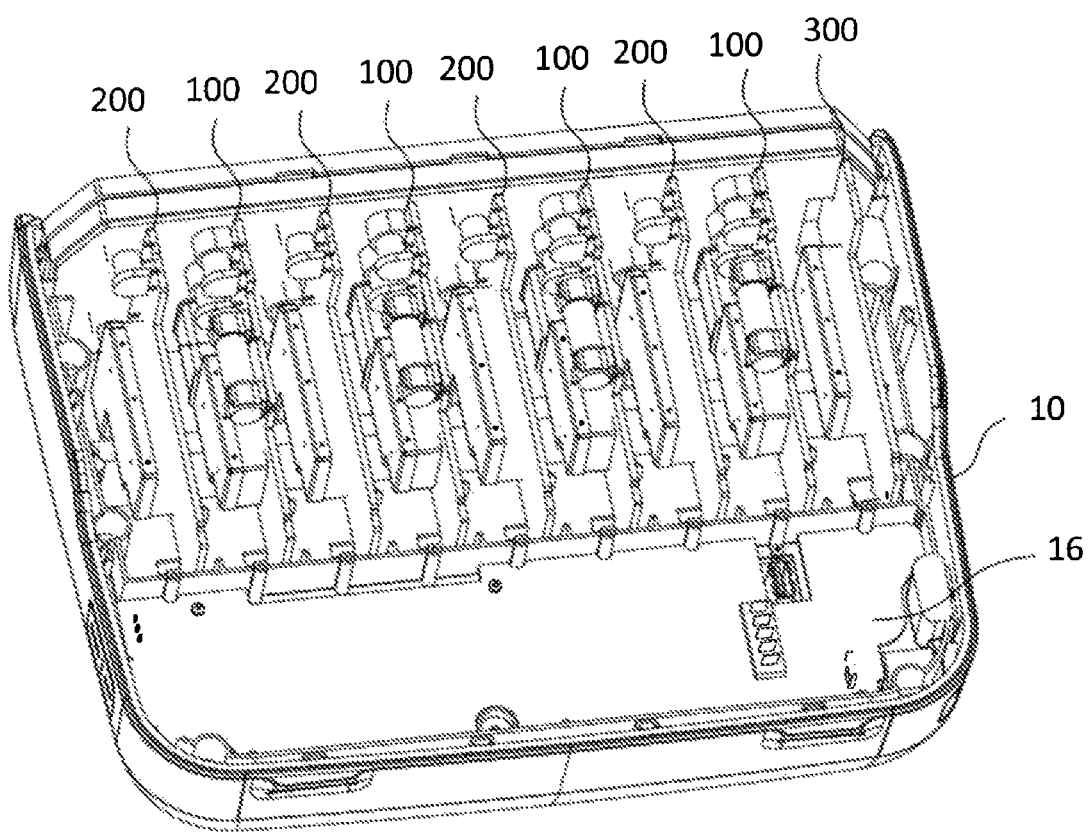
FIG. 2b shows a rear perspective view of the portable power analyzer in FIG. 2a, wherein insulating-shielding-insulating structures according to one embodiment of the present application are removed from all the channel modules.

FIG. 2b shows a rear perspective view of the portable power analyzer 10 in FIG. 2a, wherein insulating-shielding-insulating housing structures according to one embodiment of the present application are removed from all the channel modules (100, 200, 300). The details of the insulating-shielding-insulating structure will be described below.

Figure 3:
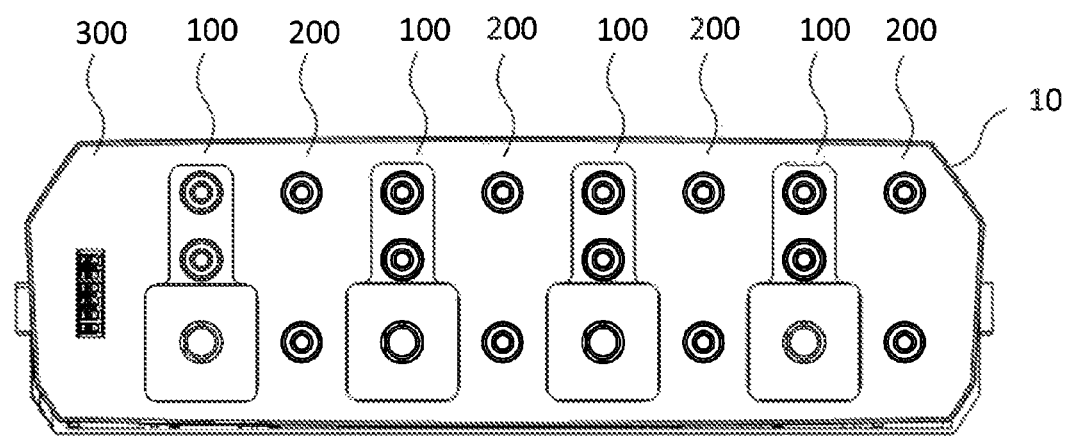
FIG. 3 shows a top view of a portable power analyzer according to one embodiment of the present application.

FIG. 3 shows a top view of a portable power analyzer 10 according to one embodiment of the present application. As shown in FIG. 3, the current detection channel modules 100, the voltage detection channel modules 200, and the motor channel module 300 include terminals separately connected to external wires and configured for receiving various inputs. Specific details of each terminal will be discussed below with respect to the detailed description of each module. It can be understood that the type and number of the terminals can be adjusted according to requirements of an actual detection function.

Figure 4:
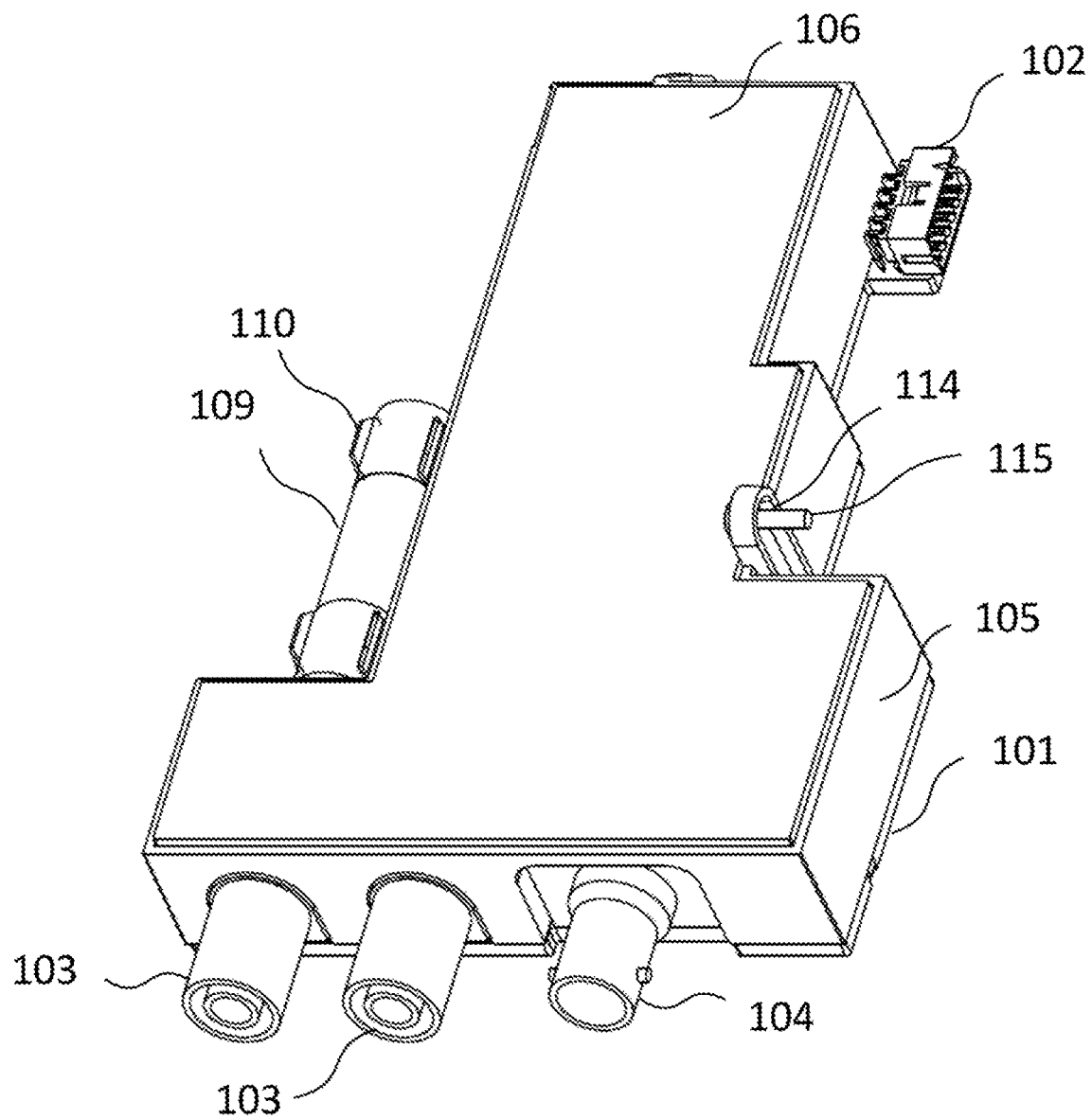
FIG. 4 shows a schematic diagram of a current detection channel module according to one embodiment of the present application.

FIG. 4 shows a schematic diagram of a current detection channel module 100 according to one embodiment of the present application. As shown in FIG. 4, the current detection channel module 100 includes a channel printed circuit board (PCB) 101 as well as a main PCA interface 102 mounted on the channel PCB 101 and electrical elements (not shown) for implementing channel functions. The main PCA interface 102 can be connected to a corresponding interface on the main PCA 16, so that the channel PCB 101 can be communicatively connected to the main PCA 16. The main PCA interface can employ a communication interface or an electrical interface that is in accordance with various specifications and standards.

With continued reference to FIG. 4, the current detection channel module 100 further includes a pair of current detection terminals 103 and a sensor terminal 104 that are coupled to the channel PCB 101. The current detection terminals 103 can receive a to-be-detected current to provide detection for an internal current sensor (not shown) in the current detection channel module 100. The sensor terminal 104 is configured to be connected to an external current sensor (not shown) to receive a signal indicating a to-be-detected current and detected by the external sensor. It can be understood that a detected current value can be obtained directly by the sensor terminal 104 when the current is directly detected by the external current sensor.

The current detection channel module 100 further includes a first insulating housing 105 and a second insulating housing 106 embedded in the first insulating housing 105. In a certain embodiment, the first insulating housing 105 can be fixed to the channel PCB 101 in a screw fastening manner. In other embodiments, the first insulating housing 105 can be attached to the channel PCB 101 by, for example, welding or bonding. The first insulating housing 105 defines a cavity (not shown) toward one side of the channel PCB 101. The cavity covers electrical elements (not shown) mounted on the channel PCB 101. In addition, although the first insulating housing 105 shown in FIG. 4 covers the major part of the channel PCB 101, in other embodiments, the first insulating housing 105 can cover less area as long as the first insulating housing 105 covers the electrical elements that need to be insulated.

Figure 5:
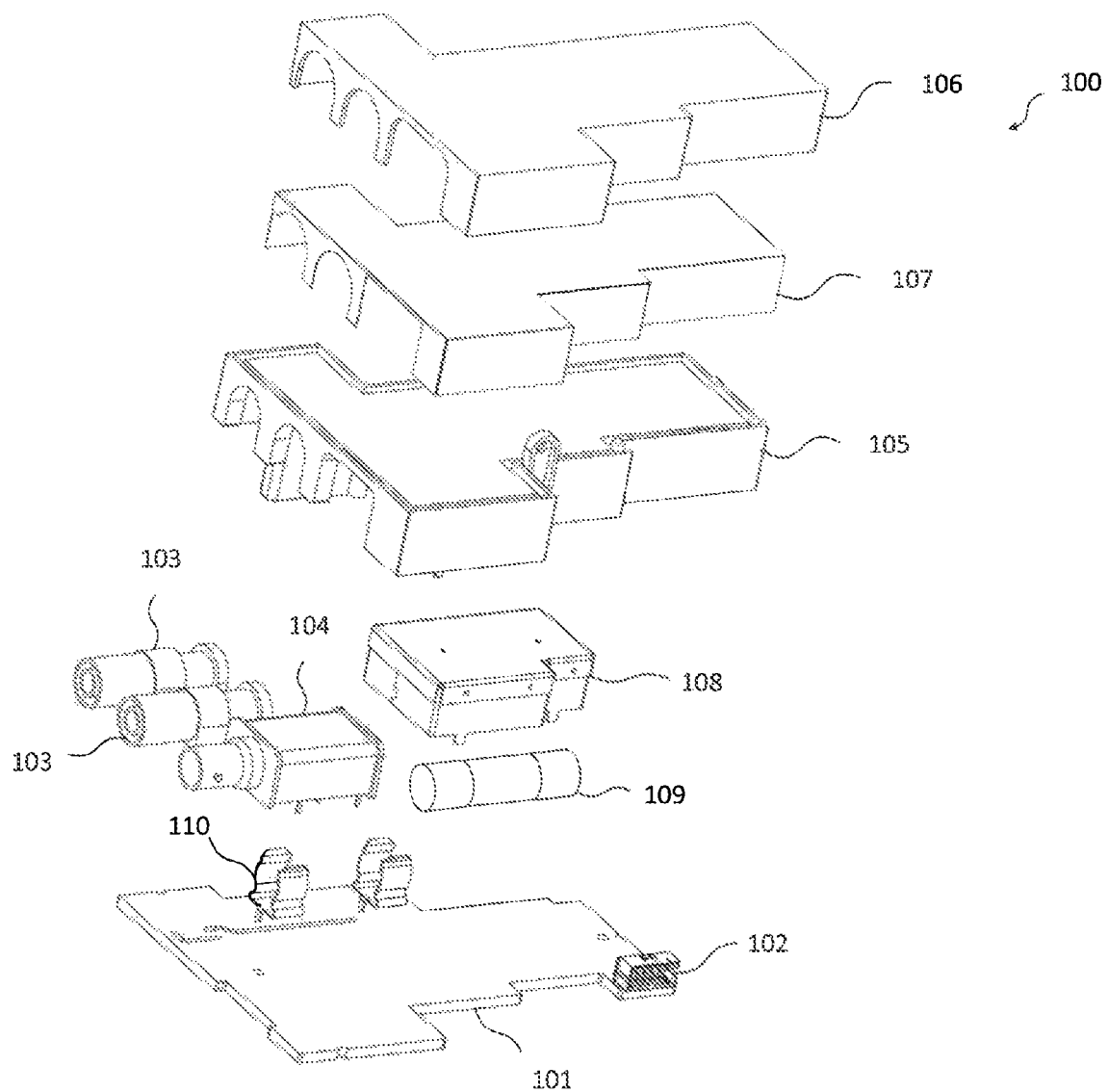
FIG. 5 shows an exploded view of a current detection channel module according to one embodiment of the present application.

FIG. 5 shows an exploded view of a current detection channel module 100 according to one embodiment of the present application. As shown in FIG. 5, the current detection channel module 100 further includes a first conductive shielding frame 107 and a second conductive shielding frame 108. In a certain embodiment, the first conductive shielding frame 107 can be mounted between the first insulating housing 105 and the second insulating housing 106, and the second conductive shielding frame 108 is mounted on the channel PCB 101 and situated in the cavity of the first insulating housing 105. In a certain embodiment, viewed from a circumferential direction, the first insulating housing 105, the second insulating housing 106, and the first conductive shielding frame 107 each have a substantially continuous circumferential surface (except portions where some electrical elements extending to the outside need to be accommodated, such as the current detection terminals 103). The structures and functions of the first conductive shielding frame 107 and the second conductive shielding frame 108 will be described below with reference to other drawings.

Figure 6:
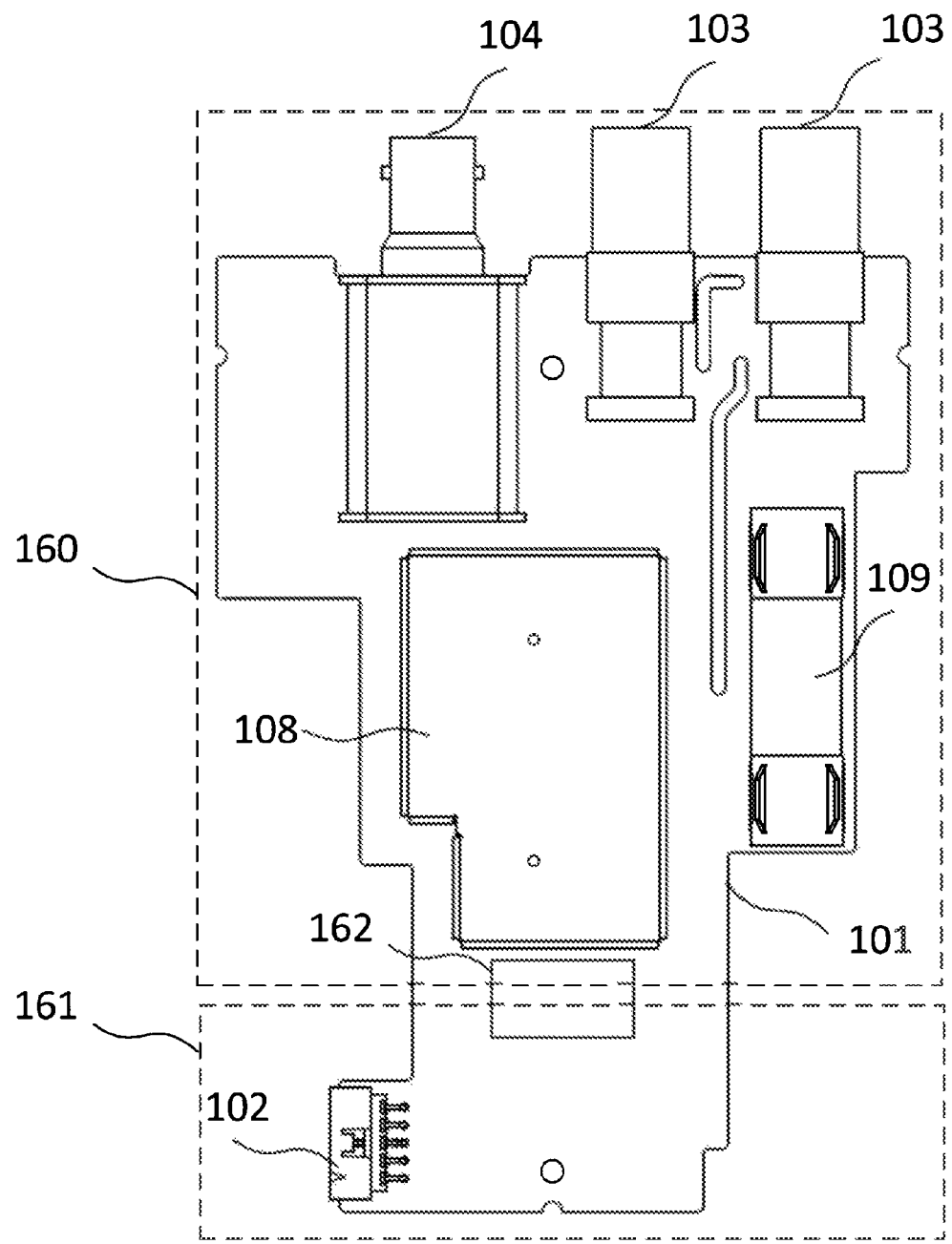
FIG. 6 shows a schematic diagram of a current detection channel module with an insulating-shielding-insulating housing structure removed according to one embodiment of the present application.

FIG. 6 shows a schematic diagram of a current detection channel module 100 with an insulating-shielding-insulating housing structure removed according to one embodiment of the present application. As shown in FIG. 6, the dashed box 160 frames a high-voltage area on the channel PCB 101, whereas the dashed box 161 frames a low-voltage area on the channel PCB 101. Those skilled in the art can understand that the high-voltage area is an area on the channel PCB where the high-voltage electrical elements are mainly mounted, whereas the low-voltage area is an area on the channel PCB where the low-voltage electrical elements are mainly mounted. The high-voltage area and the low-voltage area can be designed and adjusted according to requirements of an actual circuit and detection function. In a certain embodiment, the channel PCB 101 also includes an isolating unit 162 that is configured to isolate the high-voltage area and the low-voltage area of the channel PCB 101. Those skilled in the art can understand that the isolating unit 162 mounted on the channel PCB 101 is powered by an isolated power supply that can emit electromagnetic waves (alternating electric field) outward when providing an isolation function. As previously described, the first conductive shielding frame 107 covers the channel PCB 101 with the isolating unit 162 being mounted thereon, so that the alternating electric field generated and emitted outward by the isolating unit 162 can be shielded. In other embodiments, the isolating unit 162 can be an isolating circuit, device, or chip capable of electrically isolating the high-voltage area and the low-voltage area.

Figure 7:
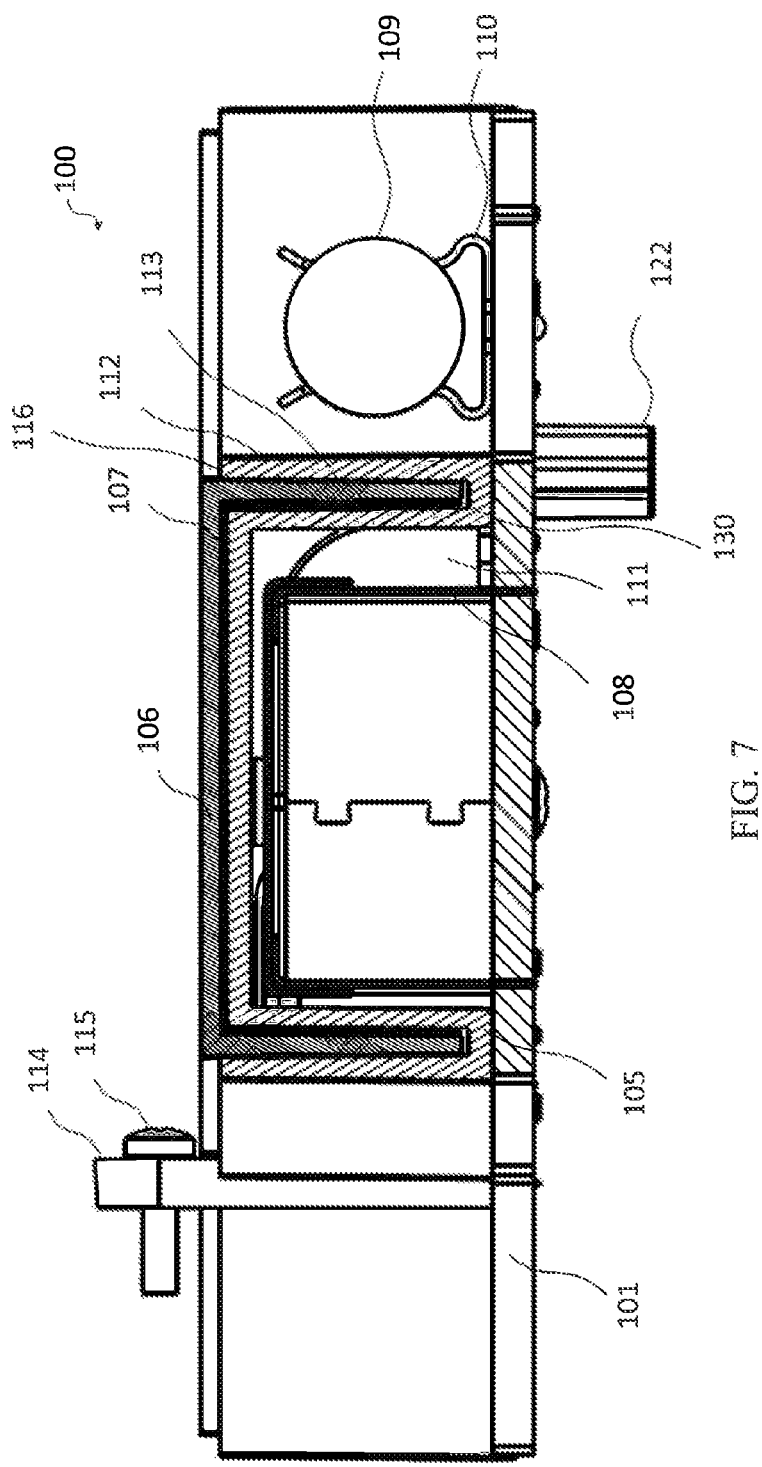
FIG. 7 shows a cross-sectional view of a current detection channel module according to one embodiment of the present application, which illustrates a section structure of the current detection channel module 100 in an assembled state.

With continued reference to FIG. 6, the second conductive shielding frame 108 is mounted to the high-voltage area of the channel PCB 101 and covers part of the high-voltage electrical elements (particularly some sensitive electrical elements) mounted on the channel PCB 101 to prevent or reduce external electromagnetic interference received by these electrical elements. FIG. 7 shows a cross-sectional view of a current detection channel module 100 according to one embodiment of the present application, which illustrates a section structure of the current detection channel module 100 in an assembled state. It can be seen from reference to FIGS. 5 and 7 that the first insulating housing 105, the second insulating housing 106, the first conductive shielding frame 107, and the second conductive shielding frame 108 each have a box-like structure that is open in a direction towards the channel PCB 101 to avoid affecting mounting of electrical elements on the channel PCB 101. As previously described, the first insulating housing 105 is attached to the channel PCB 101 and defines a cavity 111 together with the channel PCB 101. The electrical elements (not shown) mounted on the channel PCB 101 are disposed in the cavity 111.

In a certain embodiment, the first insulating housing 105 has an outwardly and reversely folded sidewall 112 on the periphery thereof. The folded sidewall 112 forms a groove 113 for accommodating portions of the second insulating housing 106 and the first conductive shielding frame 107. As shown in FIG. 7, the first conductive shielding frame 107 is attached to an inner surface of the second insulating housing 105, and the sidewall portions of the first conductive shielding frame 107 and the second insulating housing 106 are collectively accommodated in the groove 113. Through this structure, the peripheral sidewall of the first conductive shielding frame 107 can be substantially and completely sandwiched between the first insulating housing 105 and the second insulating housing 106, and embedded in the groove 113. In this embodiment, the groove 113 of the first insulating housing 105 and the sidewall portion of the second insulating housing 106 are joined together in an interference fit manner. Those skilled in the art can understand that an air gap exists between an outer surface of the sidewall portion of the second insulating housing 106 and the groove 113 of the first insulating housing 105. In other embodiments, the gap can be filled with an insulating material (such as an insulating glue).

In a certain embodiment, the first conductive shielding frame 107 can prevent the internal electromagnetic field generated by the electrical elements on the channel PCB 101 from radiating to the outside of the first conductive shielding frame 107. The first conductive shielding frame 107 also satisfies certain safety requirements. Specifically, according to the electrical equipment safety requirements of IEC 61010, a predetermined gap should exist between the shielding structure and the covered circuit (for example, 14.3 mm specified in CATIV600V/CATIII1000V class and 10.5 mm specified in CATIII600V/CATII1000V class according to requirements of IEC 61010 for different safe area ratings). Accordingly, in the structure shown in FIG. 7, the electrical distance from an end 130 of the first conductive shielding frame 107 to an upper surface of the channel PCB 101 positioned outside the cavity is actually lengthened due to the folded sidewall 112. In the structure of the embodiment shown in FIG. 7, the minimum electrical path from the end 130 of the first conductive shielding frame 107 to the high-voltage area of the channel PCB 101 is as follows: viewed in a sectional direction shown in FIG. 7, the minimum electrical path starts from the end 130, extends to an end 116 of the sidewall 112 along an inner surface of the groove 113, and then extends from the end 116 to the upper surface of the high-voltage area of the channel PCB 101 along the outermost surface of the sidewall 112 (for example, the nearest conductor on the upper surface). The minimum electrical path is set to be greater than or equal to, for example, the safe gap of 14.3 mm specified for CATIV600V/CATIII1000V in IEC 61010 as described above. Those skilled in the art can understand that this safe gap can be adjusted based on different safety rating requirements.

In a certain embodiment, the current channel detection module 100 also includes a fuse 109 and a clamp 110 clamping the fuse 109. Since the current detection channel module 100 is required to directly detect heavy current, the fuse 109 needs to be additionally provided for protection. In the embodiment having the fuse 109, the minimum distance from the end 130 of the first conductive shielding frame 107 to the fuse 109 is set to be greater than or equal to, for example, the safe gap of 14.3 mm specified for CATIV600V/CATIII1000V in IEC 61010 as described above. Specifically, the minimum electrical path from the end 130 of the first conductive shielding frame 107 to the fuse 109 is as follows: it starts from the end 130, extends to the end 116 of the sidewall 112 along the inner surface of the groove 113, and then linearly extends from the end 116 to the outer surface portion of the fuse 109 closest to the end 116.

It should be noted that the end 130 of the first conductive shielding frame 107 shown in FIG. 7 is shown as substantially extending to the bottom of the groove 113. In other embodiments, however, the end 130 can extend to any position of any distance relative to the bottom of the groove 113. In other embodiments, the first conductive shielding frame 107 can have a folded sidewall similar to the first insulating housing 105. At this point, the end 130 of the first conductive shielding frame 107 extends to the outer surface of the second insulating housing 106. In certain embodiments, the end 130 of the first conductive shielding frame 107 does not extend out of the groove 113. It can be understood that no matter where the end 130 of the first conductive shielding frame 107 is situated in the groove 113, it is only necessary that the minimum electrical distance of the end 130 from the channel PCB 101 or the fuse 109 is greater than or equal to a predetermined gap (for example, 14.3 mm for CATIV600V/CATIII1000V according to IEC 61010).

Referring now to FIGS. 4 and 7, the current detection channel module 100 further includes a locking member 114 attached to the first insulating housing 105 and a bolt 115 capable of threadingly engaging with the locking part 114. When the main PCA interface 102 of the current detection channel module 100 is connected to the main PCA 16, the locking member 114 can be fixed to the main PCA 16 using the bolt 115, thereby mechanically fixing the current detection channel module 100 to the main PCA 16. It can be understood that with this fixing manner, the current detection channel module 100 can be easily removed or replaced by removing the bolt 115. Those skilled in the art can adopt other common methods to fix the current detection channel module 100 to the main PCA 16. Such methods are not limited in the present application.

Figure 8:
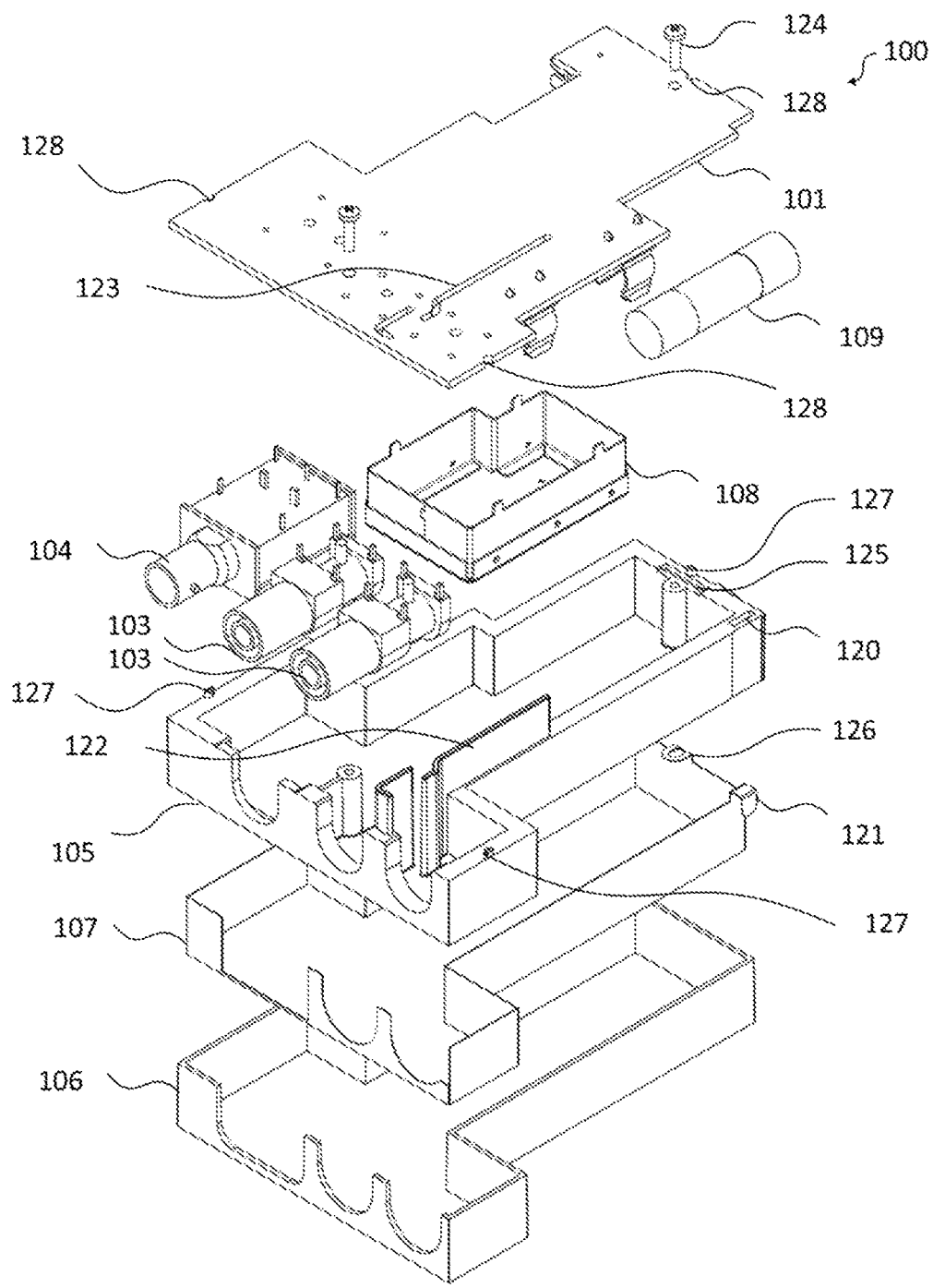
FIG. 8 shows another exploded view of a current detection channel module according to one embodiment.

FIG. 8 shows another exploded view of the current detection channel module 100 according to one embodiment. As shown in FIG. 8, the first insulating housing 105 further includes a first through-hole 120 positioned in the bottom of the groove 113, and the first conductive shielding frame 107 includes a first lug 121 extending from the sidewall. When the first conductive shielding frame 107 is mounted on the first insulating housing 105, the first lug 121 can extend through the first through-hole 120. In some embodiments, after extending through the first through-hole 120, the first lug 121 can be bent outward as shown in FIG. 8 to fasten to the outer wall of the first insulating housing 105. Those skilled in the art can understand that when the portable power analyzer 10 has an integral shield, the first lug 121 can be connected thereto, thereby enhancing the overall shielding effect of the portable power analyzer 10.

With continued reference to FIG. 8, in a certain embodiment, the first insulating housing 105 includes a ridge 122 extending toward the channel PCB 101, and the ridge 122 is positioned in the cavity of the first insulating housing 105 to isolate the two current detection terminals 103 of the current detection channel module 100. Those skilled in the art can understand that if the fuse 109 is blown, the ridge 122 can provide additional safety distance between the two current detection terminals 103. In certain embodiments, the channel PCB 101 includes a corresponding slot 123. When the insulating housing 105 is mounted to the channel PCB 101, the ridge 122 is embedded into the slot 123. In a certain embodiment, the side of the first insulating housing 105 facing the PCB 101 further includes a plurality of bumps 127, and the edge of the channel PCB 101 further includes a corresponding plurality of notches 128. When the first insulating housing 105 is mounted to the channel PCB 101, the bumps 127 can be embedded into the notches 128 to prevent the first insulating housing 105 from moving laterally relative to the channel PCB 101. In a certain embodiment, when the first insulating housing 105 is mounted on the channel PCB 101, the first insulating housing 105 can be fixed to the channel PCB 101 in a screw fastening manner (for example, using a screw 124).

In a certain embodiment, the first insulating housing 105 also includes a second through-hole 125, and the first conductive shielding frame 107 also includes a second lug 126. Similar to the first through-hole 120 and the first lug 121, the second lug 126 can extend through the second through-hole 125 and be folded as shown in FIG. 8 after passing through the second through-hole 125. In a certain embodiment, when the first insulating housing 105 is fixed to the channel PCB 101 using the screw 124, the screw 124 also passes through a small hole in the second lug 126 so that the first conductive shielding frame 107 can be fixed to the first insulating housing 105. In addition, it can be understood that the second lug 121 is connected to the channel PCB 101, so that the first conductive shielding frame 107 is connected to a low-voltage ground (not shown) of the channel PCB 101.

In a certain embodiment, the second conductive shielding frame 108 is connected to a high-voltage ground and forms a capacitance device together with the first conductive shielding frame 107 connected to the low-voltage ground and the first insulating housing 105 separating the second conductive shielding frame 108 from the first conductive shielding frame 107. The capacitance device improves the electromagnetic compatibility of the current detection channel module 100. As previously described, the first conductive shielding frame 107 connected to the low-voltage ground can filter out the electromagnetic radiation generated by the internal electrical elements (for example, the isolating unit 162), whereas the second conductive shielding frame 108 connected to the high-voltage ground can resist the electromagnetic interference of external electromagnetic fields on the electrical elements in the second conductive shielding frame 108.

Figure 9:
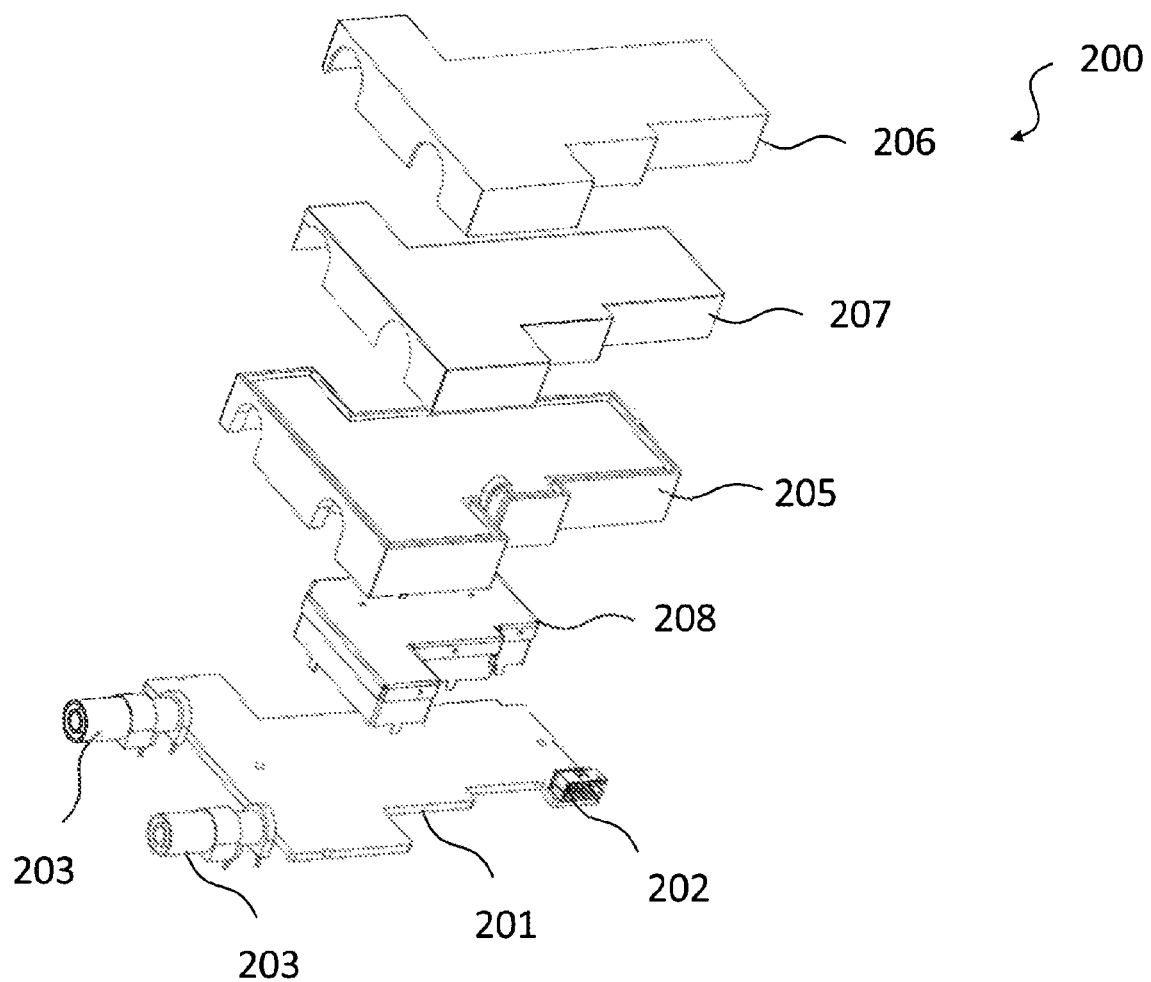
FIG. 9 shows an exploded view of a voltage detection channel module according to one embodiment of the present application.

FIG. 9 shows an exploded view of a voltage detection channel module 200 according to one embodiment of the present application. Parts in FIG. 9 similar to those of the current detection channel module 100 are denoted by similar reference numerals plus 100. As shown in FIG. 9, the voltage detection channel module 200 includes a channel PCB 201, a main PCA interface 202 for connecting to the main PCA 16, and a voltage detection terminal 203 for receiving a to-be-detected voltage. In addition, the voltage detection channel module 200 also includes a first insulating housing 205, a second insulating housing 206, a first conductive shielding frame 207, and a second conductive shielding frame 208. The first insulating housing 205, the second insulating housing 206, the first conductive shielding frame 207, and the second conductive shielding frame 208 have the same structures and functions as the first insulating housing 105, the second insulating housing 106, the first conductive shielding frame 107, and the second conductive shielding frame 108, and therefore will not be described again herein.

Figure 10:
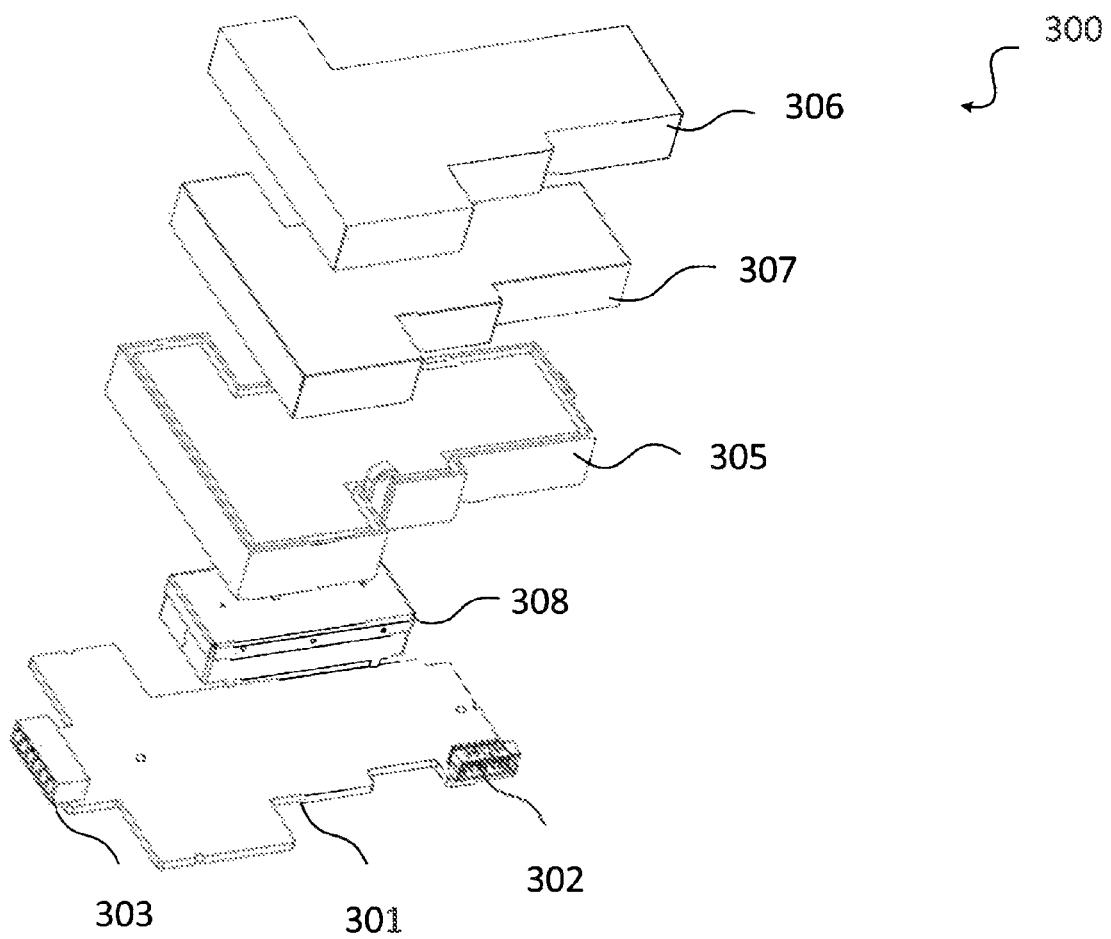
FIG. 10 shows an exploded view of a motor channel module according to one embodiment of the present application.

FIG. 10 shows an exploded view of a motor channel module 300 according to one embodiment of the present application. Parts similar to those of the current detection channel module 100 are denoted by similar reference numerals plus 200. As shown in FIG. 10, the voltage detection channel module 300 includes a channel PCB 301, a main PCA interface 302 for connecting to the main PCA 16, and a motor detection terminal 303 for receiving rotational speed and/or torque parameters of a to-be-detected motor. In addition, the voltage detection channel module 300 also includes a first insulating housing 305, a second insulating housing 306, a first conductive shielding frame 307, and a second conductive shielding frame 308. The first insulating housing 305, the second insulating housing 306, the first conductive shielding frame 307, and the second conductive shielding frame 308 have the same structures and functions as the first insulating housing 105, the second insulating housing 106, the first conductive shielding frame 107, and the second conductive shielding frame 108, and therefore will not be described again herein.

Those of ordinary skill in the art can understand and implement other variations to the disclosed embodiments by studying the specification, the disclosure, the accompanying drawings and the appended claims. In the claims, the word "comprise" does not exclude other elements or steps, and the word "a" or "an" does not exclude plurality. In practical application of the present application, one component may perform functions of multiple technical features cited in the claims.

The various embodiments described above can be combined to provide further embodiments. Aspects of the embodiments can be modified in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic measuring device, comprising:
    a main printed circuit assembly; and
    one or more channel modules mechanically and electrically connected to the main printed circuit assembly, wherein at least one channel module of the one or more channel modules comprises:
        a channel printed circuit board electrically connected to the main printed circuit assembly, the channel printed circuit board having a first side and an opposing second side;
        a first insulating housing disposed on the first side of the channel printed circuit board, the first insulating housing defining a cavity, the cavity covering at least part of electrical elements mounted on the first side of the channel printed circuit board;
        a first conductive shielding frame at least partially disposed on the first insulating housing and separated from the cavity and the channel printed circuit board by the first insulating housing, the first conductive shielding frame covering the at least part of the electrical elements mounted on the first side of the channel printed circuit board; and
        a second insulating housing disposed on the first conductive shielding frame and configured to sandwich the first conductive shielding frame between the second insulating housing and the first insulating housing, which lengthens an electrical path from the first conductive shielding frame to the channel printed circuit board outside the cavity.

2. The electronic measuring device according to claim 1, wherein the channel printed circuit board comprises a high-voltage area and a low-voltage area, the high-voltage area and the low-voltage area being isolated by an isolating unit.

3. The electronic measuring device according to claim 2, wherein the channel printed circuit board comprises a main printed circuit assembly interface for electrically connecting to the main printed circuit assembly, and the main printed circuit assembly interface is mounted on the low-voltage area of the channel printed circuit board.

4. The electronic measuring device according to claim 2, wherein the electronic measuring device further comprises a second conductive shielding frame disposed on the first side of the channel printed circuit board and positioned in the cavity of the first insulating housing, and the second conductive shielding frame covers at least part of high-voltage electrical elements mounted on the high-voltage area to prevent or reduce external electromagnetic interference received by the at least part of the high-voltage electrical elements.

5. The electronic measuring device according to claim 4, wherein the first conductive shielding frame is electrically connected to a low-voltage ground of the low-voltage area, whereas the second conductive shielding frame is electrically connected to a high-voltage ground of the high-voltage area.

6. The electronic measuring device according to claim 1, wherein the first conductive shielding frame is configured such that radiation of an electromagnetic field therein to outside of the first conductive shielding frame is reduced.

7. The electronic measuring device according to claim 1, wherein the at least one channel module comprises a motor channel module comprising:
    a motor detection terminal configured to receive signals indicating a rotational speed and/or torque of a motor.

8. The electronic measuring device according to claim 1, wherein the at least one channel module comprises a current detection channel module comprising:
    a pair of current detection terminals configured to receive a to-be-detected current.

9. The electronic measuring device according to claim 8, wherein the current detection channel module further comprises:
    a sensor terminal configured to be connected to an external current sensor to receive a signal indicating the to-be-detected current detected by the external current sensor.

10. The electronic measuring device according to claim 8, wherein the current detection channel module further comprises a fuse mounted on the channel printed circuit board, and wherein an electrical path from the first conductive shielding frame to the fuse has a minimum length being greater than or equal to a predetermined length in accordance with the IEC 61010 standard.

11. The electronic measuring device according to claim 1, wherein the at least one channel module comprises a voltage detection module comprising:

a pair of voltage detection terminals configured to receive a to-be-detected voltage.

12. The electronic measuring device according to claim 1, wherein:
the first insulating housing has a folded sidewall positioned on a periphery of the first insulating housing,
the folded sidewall defines a groove for accommodating the first conductive shielding frame and the second insulating housing, and
the first conductive shielding frame is attached to an inner surface of the second insulating housing, and
wherein the folded sidewall lengthens the electrical path from the first conductive shielding frame to the channel printed circuit board outside the cavity.

13. The electronic measuring device according to claim 12, wherein a portion of the first conductive shielding frame extends along the inner surface of the second insulating housing.

14. The electronic measuring device according to claim 12, wherein a portion of the first conductive shielding frame extends outward from the inner surface of the second insulating housing and extends to a portion of an outer surface of the second insulating housing.

15. The electronic measuring device according to claim 12, wherein a gap exists between at least part of an outer surface of the second insulating housing and the first insulating housing.

16. The electronic measuring device according to claim 15, wherein the gap is filled with an insulating material.

17. The electronic measuring device according to claim 1, wherein the electronic measuring device is a power analyzer.

18. The electronic measuring device according to claim 17, wherein the power analyzer is a portable power analyzer.

* * * * *